(12) United States Patent
Yin

(10) Patent No.: US 11,265,631 B2
(45) Date of Patent: Mar. 1, 2022

(54) SPEAKER BOX

(71) Applicant: AAC Technologies Pte. Ltd., Singapore (SG)

(72) Inventor: Zhaoyu Yin, Shenzhen (CN)

(73) Assignee: AAC Technologies Pte. Ltd., Singapore (SG)

(*) Notice: Subject to any disclaimer, the term of this patent is extended or adjusted under 35 U.S.C. 154(b) by 70 days.

(21) Appl. No.: 16/989,924

(22) Filed: Aug. 11, 2020

(65) Prior Publication Data
US 2021/0051384 A1 Feb. 18, 2021

(30) Foreign Application Priority Data

Aug. 16, 2019 (CN) .......................... 201921336746.4

(51) Int. Cl.
H04R 1/02 (2006.01)
H04R 1/28 (2006.01)
H05K 1/02 (2006.01)
H05K 1/18 (2006.01)

(52) U.S. Cl.
CPC ........... H04R 1/025 (2013.01); H04R 1/2888 (2013.01); H05K 1/028 (2013.01); H05K 1/189 (2013.01); H04R 2400/11 (2013.01)

(58) Field of Classification Search
CPC .. H04R 1/025; H04R 1/2888; H04R 2400/11; H05K 1/028; H05K 1/189
USPC .................................................... 381/386
See application file for complete search history.

(56) References Cited

U.S. PATENT DOCUMENTS

2019/0028804 A1* 1/2019 Zhao ................. H04R 9/02
2020/0213695 A1* 7/2020 Feng ................. H04R 1/026

FOREIGN PATENT DOCUMENTS

| CN | 108124225 A | * | 6/2018 | ............ H04R 1/021 |
| CN | 108235198 A | * | 6/2018 | ............ H04R 9/06 |
| CN | 108307277 A | * | 7/2018 | |
| CN | 108551638 A | * | 9/2018 | |
| WO | WO-2020029639 A1 | * | 2/2020 | ............ H04R 1/06 |

* cited by examiner

Primary Examiner — Sean H Nguyen
(74) Attorney, Agent, or Firm — W&G Law Group

(57) ABSTRACT

The present invention provides a speaker box having an upper cover, a lower cover mated with the upper cover to form an accommodation space and a speaker unit accommodated in the accommodation space. The speaker box also includes an elastic piece electrically connected to the speaker unit and a flexible circuit board electrically connected to the elastic piece. One end of the elastic piece is connected to the speaker unit and the other end is bent and extended to the extension part. The flexible circuit board is connected to the elastic piece on the extension part and extends out of the accommodation space. The speaker box provided by the present invention can smoothly draw out the flexible circuit board to the position of the feed point, thereby effectively ensuring the communication between the flexible circuit board and the external circuit.

10 Claims, 3 Drawing Sheets

SPEAKER BOX

FIELD OF THE PRESENT DISCLOSURE

The present invention relates to the technical field of electroacoustic transducers, in particular to a speaker box for generating sound.

DESCRIPTION OF RELATED ART

With the advent of the mobile Internet era, the number of smart mobile terminals is increasing continuously. Among many mobile terminals, mobile phone is undoubtedly the most common and portable mobile terminal. At present, the functions of mobile phones are extremely diverse, one of which is the function of high-quality music, so the speaker box used to play sound has been widely applied to the current intelligent mobile terminals.

Currently, the speaker box of a related art is usually introduced through the flexible circuit board. The speaker box comprises an upper cover, a lower cover mated with the upper cover to form an accommodation space and a speaker unit accommodated in the accommodation space.

The upper cover comprises a top wall, a side wall formed by bending and extending in the direction from the periphery of the top wall to the lower cover, and an extension part formed by extending outwardly from the side wall. However, the distance between the speaker unit and the side wall is too short, the speaker unit is near the outer space limit of the side wall, and the internal flexible circuit board is trapped in the deep pit formed by the speaker unit and the side wall, with the width of 0.8 mm available for placing the flexible circuit board to its limit, the flexible circuit board has no space to climb and be drawn to the feed point position.

Therefore, it is necessary to provide a new speaker box to solve the above problems.

SUMMARY OF THE INVENTION

One of the main objects of the present invention is to provide a speaker box effectively ensuring the communication between a flexible circuit board and an external circuit thereof.

Accordingly, the present invention provides a speaker box comprising:

an upper cover having a top wall, a side wall formed by bending and extending from the periphery of the top wall to the lower cover, an extension part formed by extending from the side wall;

a lower cover assembled with the upper cover for forming an accommodation space;

a speaker unit accommodated in the accommodation space;

a flexible circuit board connecting the speaker unit to an external circuit;

an elastic piece electrically connecting the flexible circuit board to the speaker unit; wherein the elastic piece comprises a welding part connected to the speaker unit, a connection part fixed to the extension part and a bending part connecting the welding part and the connection part; a projection of the welding part in the side wall thickness direction and a projection of the connection part in the side wall thickness direction are spaced apart from each other; the flexible circuit board is connected with the connection part and extends out of the accommodation space to be connected with an external circuit.

Further, the bending part is formed by bending and extending from the welding part in the direction close to the lower cover, the connection part is formed by bending and extending from one end of the bending part away from the welding part in the direction away from the speaker unit, and the connection part is located on the extension part.

Further, the speaker unit is provided with a welding plate for electrical connection, and the welding part is welded and fixed with the welding plate.

Further, the extension part comprises a main body formed by extending from the side wall and positioning columns formed by protruding and extending from the main body in the direction close to the lower cover; the connection part comprises positioning areas and a welding area connected with the positioning areas; the positioning areas are provided with positioning holes mated with the positioning columns, the positioning columns are correspondingly inserted into the positioning hole, and the flexible circuit board is welded and fixed with the welding area.

Further, the positioning areas are spaced from each other, and the welding areas are located between the two positioning areas; both the positioning areas are provided with the positioning holes, the positioning columns are provided with two, and the two positioning columns are respectively arranged corresponding to the two positioning holes.

Further, the flexible circuit board comprises a welding plate part which is welded with the welding area and a conductive part which is connected with the welding plate part at one end and extends out of the accommodation space at the other end.

Further, the extension part further comprises a protruding platform formed by extending from an edge of the main body in the direction close to the lower cover; the conductive portion comprises a first portion bending and extending from the welding plate part in the direction away from the lower cover and located on the main body, a second portion extending from an end of the first portion near the protruding platform along the protruding platform in the direction close to the lower cover, and a third portion formed by bending and extending from an end of the second portion away from the first portion in the direction away from the accommodation space, the third portion being located partially outside the accommodation space.

Further, the lower cover comprises a bottom wall, a side surface formed by bending and extending from a periphery of the bottom wall in the direction close to the upper cover, an avoidance groove formed by being depressed from a side of the side surface near the upper cover in the direction away from the upper cover, and a feed point part extending from the side surface in the direction away from the accommodation space; the avoidance groove is arranged corresponding to the protruding platform, the feed point part is located on a side of the avoidance groove away from the protruding platform, the third portion is connected to the feed point part.

Further, the speaker box includes two elastic pieces, wherein the two elastic pieces are arranged opposite to each other with a distance and are respectively connected with the speaker unit.

Further, the elastic piece further comprises a mounting hole extending through the welding part.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to several exemplary embodiment. To make the technical problems to be solved, technical solutions and beneficial effects of the present disclosure more apparent, the present disclosure is described in further detail together with the figure and the embodiment. It should be understood the specific embodiments described hereby is only to explain the disclosure, not intended to limit the disclosure.

Figure 1:
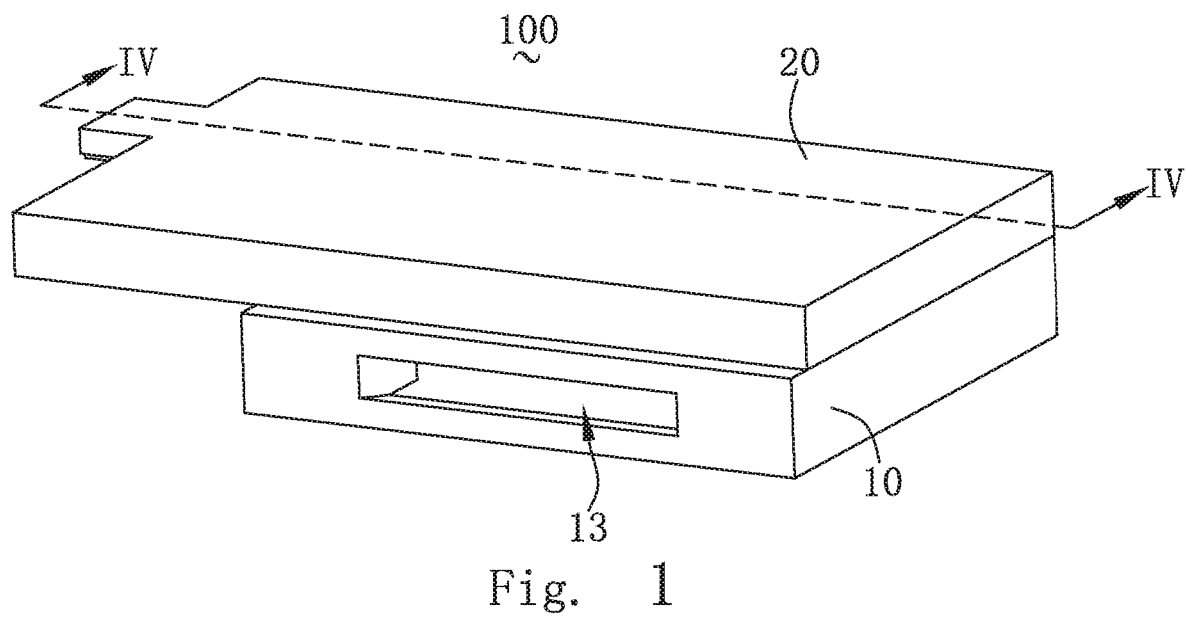
FIG. 1 is a isometric view of a speaker box in accordance with an exemplary embodiment of the present invention.
Figure 2:
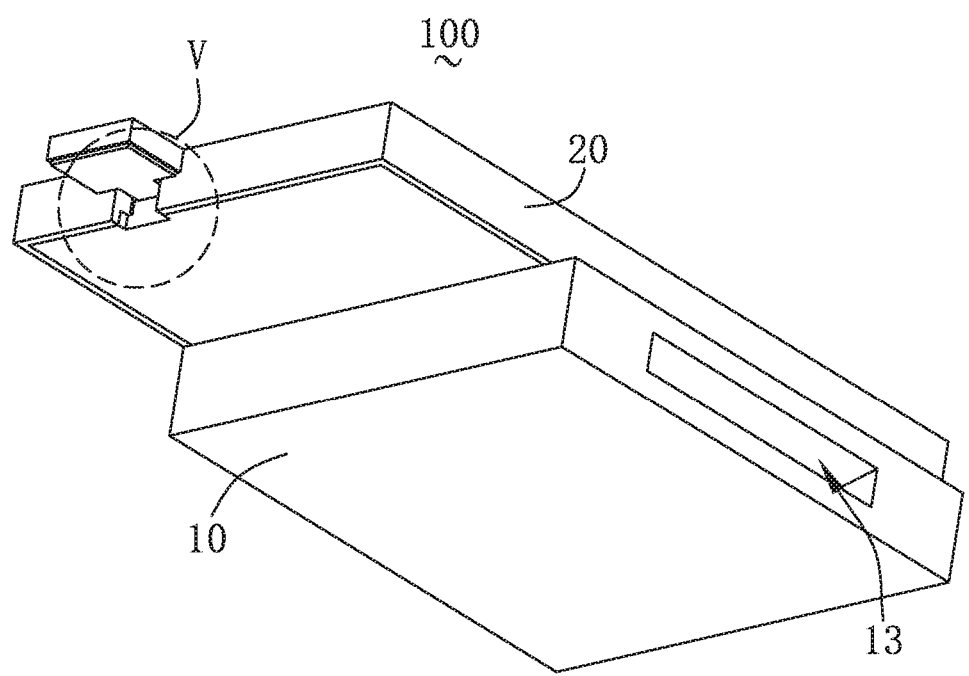
FIG. 2 is another isometric view of the speaker box shown in FIG. 1.
Figure 3:
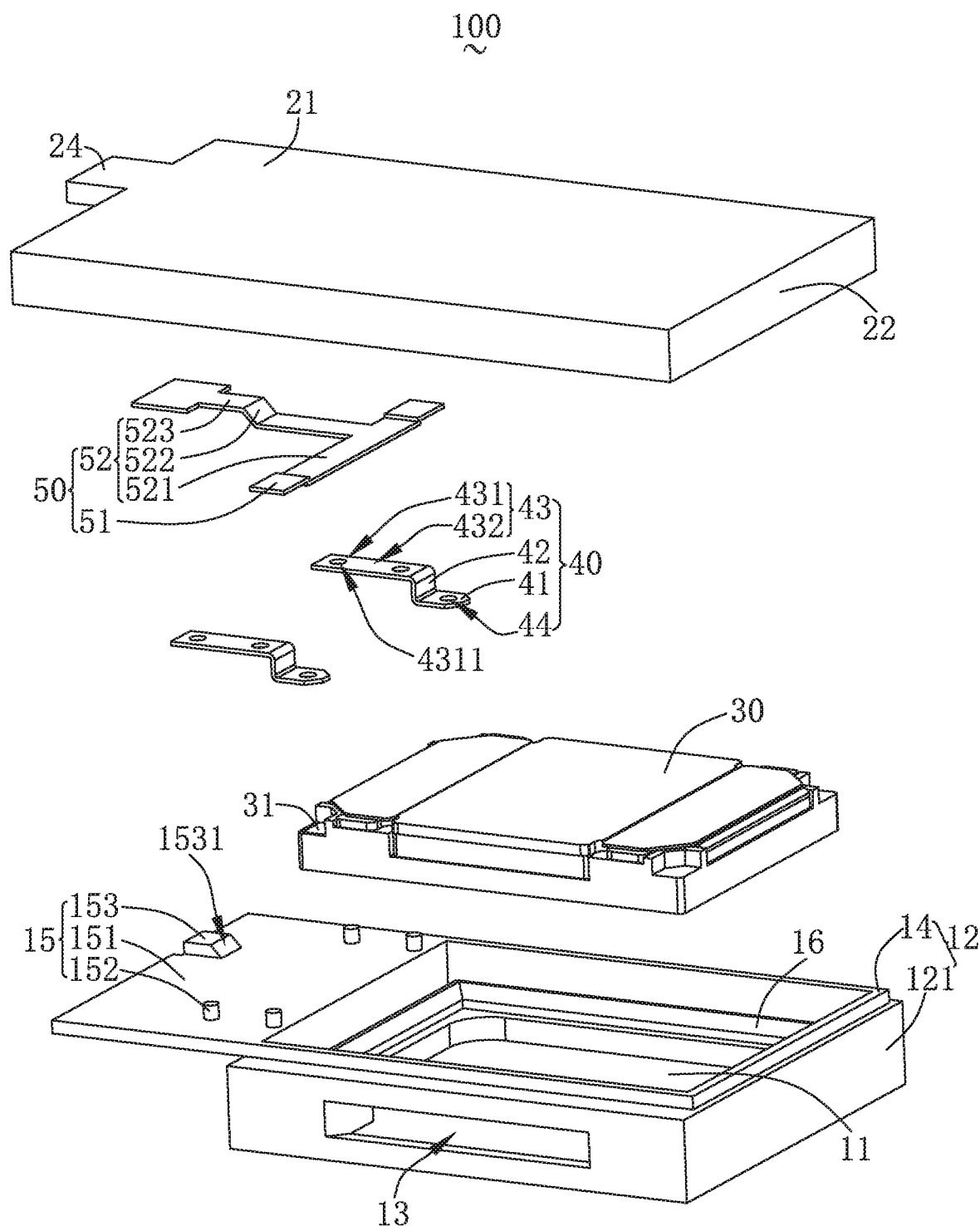
FIG. 3 is an exploded view of the speaker box shown in FIG. 1.
Figure 4:
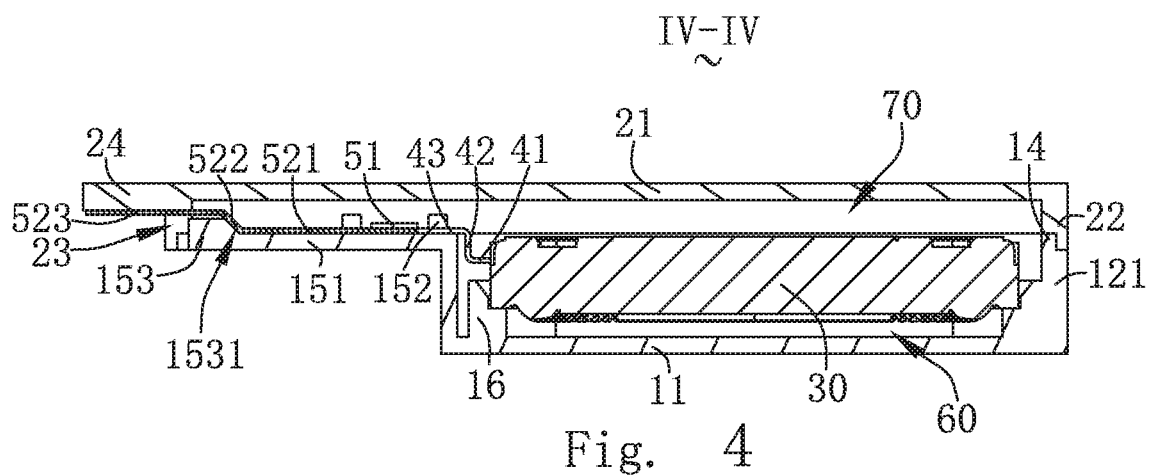
FIG. 4 is a cross-sectional view of the speaker box taken along line IV-IV shown in FIG. 1.
Figure 5:
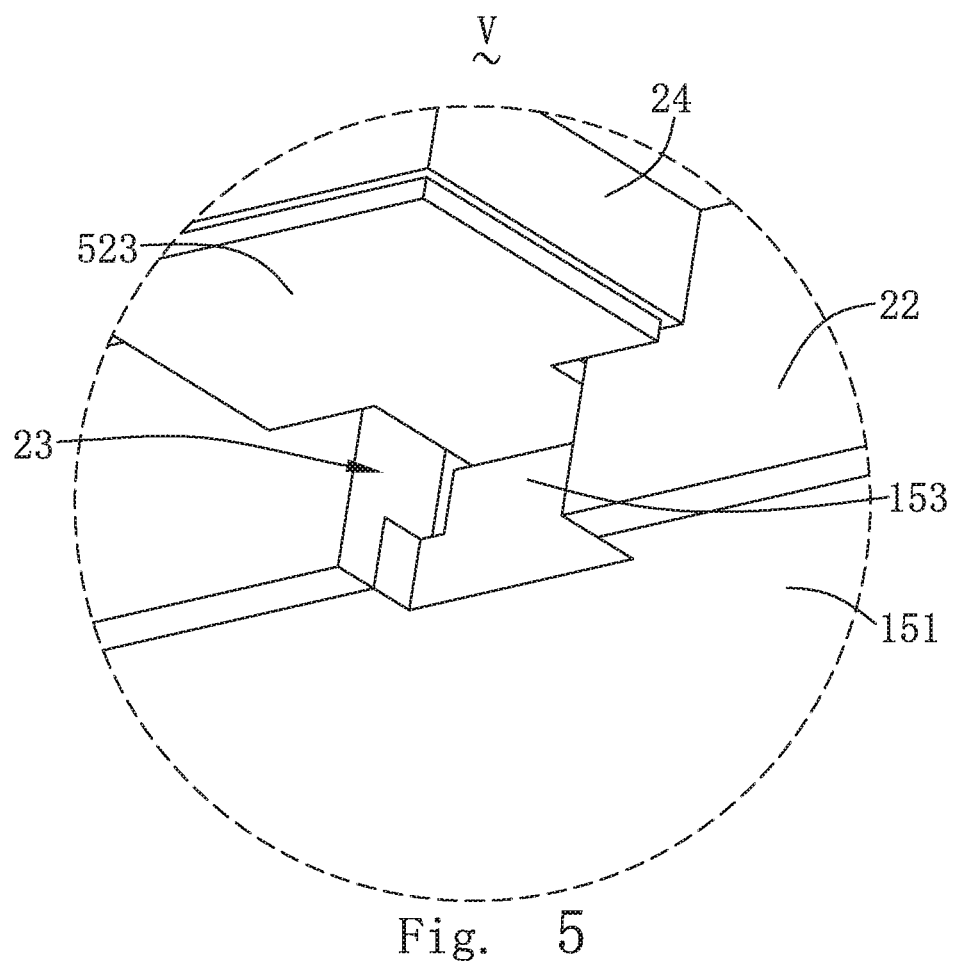
FIG. 5 is a partially enlarged view of Part V shown in FIG. 2.

Please refer to FIGS. 1-5. The present invention provides a speaker box 100, which comprises an upper cover 10, a lower cover 20 which is mated with the upper cover 10 to form an accommodation space, a speaker unit 30 accommodated in the accommodation space, a flexible circuit board 50 connecting the speaker unit 30 to an external circuit and an elastic piece 40 connecting the flexible circuit board 50 to the speaker unit 30.

The upper cover 10 comprises a top wall 11, a side wall 12 bending and extending in the direction from the periphery of the top wall 11 to the lower cover 20, a sound conduction channel 13 formed on the side wall 12, an extension part 15 formed by extending outwardly from the side wall 12, and a support wall 16 formed by extending in the direction from the top wall 11 toward the lower cover 20 to fix the speaker unit 30. The side wall 12 comprises a side wall body 121 and a step portion 14 formed by extending from the side wall body 121 toward the lower cover 20. The extension part 15 is formed by extending from the step part 14 in the direction away from the speaker unit 30.

The extension part 15 comprises a main body 151 extending from the step part 14, positioning columns 152 extending from the main body 151 in the direction close to the lower cover 20 and a protruding platform 153 formed by protruding from the edge of the main body 151 in the direction close to the lower cover 20.

The lower cover 20 comprises a bottom wall 21 facing and spaced from the top wall 11, a side surface 22 bending and extending from the periphery of the bottom wall 21 in the direction close to the upper cover 10, an avoidance groove 23 formed by being depressed from a side of the side surface 22 near the upper cover 10 in the direction away from the upper cover 10, and a feed point part 24 formed by extending from the side surface 22 in the direction away from the accommodation space. The avoidance groove 23 is arranged corresponding to the protruding platform 153, and the feed point part 24 is located on the side of the avoidance groove 23 away from the protruding platform 153.

The speaker unit 30 and the support wall 16 are glued and fixed, and the speaker unit 30 and the top wall 11 are spaced to form a front acoustic cavity 60. The speaker 30 and the upper cover 10 and the lower cover 20 together enclose to form a back cavity 70, and the sound conduction channel 13 communicates with the front acoustic cavity 60 to form a side sounding structure. The sound conduction channel 13 communicates with the front acoustic cavity 60 to form a front cavity for sound generation, and the back cavity 70 is used to improve the low-frequency acoustic performance of the speaker box 100.

The speaker unit 30 is provided with a welding plate 31 for electrical connection, and the elastic piece 40 is fixed by welding with the welding plate 31.

One end of the elastic piece 40 is welded and fixed with the speaker unit 30, and the other end is bending and extending to the extension part 15. The flexible circuit board 50 is connected to the elastic piece 40 located on the extension part 15 and extends out of the accommodation space.

The elastic piece 40 comprises a welding part 41 connected to the speaker unit 30, a bending part 42 formed by bending and extending from the welding part 41 in the direction close to the lower cover 20 and a connection part 43 bending and extending from a end of the bending part 42 away from the welding part 41 in a direction away from the speaker unit 30; the connection part 43 is located on the extension part 15 and fixed to the extension part 15, the bending part 42 connects the welding part 41 and the connection part 43, the flexible circuit board 50 is connected to the connection part 43 and extends out of the accommodation space to be connected to an external circuit. The projection of the welding part 41 in the thickness direction of the side wall 12 and the projection of the connection part 43 in the thickness direction of the side wall 12 are spaced apart from each other.

Specifically, the welding part 41 and the connection part 43 are arranged in parallel with each other, and the welding part 41 is welded and fixed to the speaker unit 30 by soldering the brushed tin on the welding plate 31. Preferably, the elastic piece 40 further comprises a mounting hole 44 provided through the welding part 41, and the welding effect between the welding part 41 and the speaker unit 30 can be improved by providing the mounting hole 44. So that the connection between the welding part 41 and the speaker unit 30 is more secure and is not easy to fall off.

The connection part 43 comprises positioning areas 431 and a welding area 432 connected to the positioning areas 431. The positioning areas 431 is provided with positioning holes 4311 mated with the positioning columns 152, and the positioning columns 152 are correspondingly inserted into the positioning holes 4311. The flexible circuit board 50 is fixed by welding with the welding area 432.

The positioning areas 431 are provided with two and are arranged spaced from each other, and the welding areas 432 are located between the two positioning areas 431. The two positioning areas 431 are respectively provided with the positioning holes 4311. The positioning columns 152 are provided with two corresponding positioning holes 4311, and the two positioning columns 152 are respectively inserted into the two positioning holes 4311 correspondingly. The connection part 43 is positioned and fixed by the two positioning columns 152, so that the elastic piece 40 can be guaranteed not to be rotated and shifted, and the elastic piece 40 can be guaranteed not to be warped after the hot spot.

Specifically, two elastic pieces 40 are provided, and the two elastic piece 40 are arranged opposite to each other with distance and are respectively welded with the two welding plates 31 of the speaker unit 30 and are respectively extended to the extension part 15. The structural shapes of the two elastic piece 40 are identical, and each elastic piece 40 comprises two positioning areas 431, and the positioning columns 152 is provided with four, four of the positioning columns 152 are paired to correspond to two of the elastic piece 40 settings.

The elastic piece 40 is welded to the speaker unit 30 and bent and extended onto the extension part 15. Thus, the flexible circuit board 50 and the speaker unit 30 are conducted through the elastic piece 40, and the flexible circuit board 50 is located on the extension part 15 and can be drawn out freely, not limited by the space between the speaker unit 30 and the step portion 14, so that the speaker box 100 can be smoothly communicated with the external circuit through the flexible circuit board 50.

The flexible circuit board 50 comprises a welding plate part 51 welded to the welding area 432 and a conductive part 52 connected at one end to the welding plate part 51 and extending out of the accommodation space at the other end. The welding plate part 51 is soldered and fixed to the connection part 43 by brushing tin in the welding area 432. Specifically, the welding plate part 51 is provided with two corresponding elastic piece 40, and the two welding plate parts 51 are welded with the welding areas 432 of the two elastic piece 40 correspondingly.

The conductive portion 52 comprises a first portion 521 bending and extending from the welding plate part 51 in the direction away from the lower cover 20 and located on the main body 151, a second portion 522 extending from an end of the first portion 521 near the protruding platform 153 along the protruding platform 153 in the direction close to the lower cover 20, and a third portion 523 formed by bending and extending from an end of the second portion 522 away from the first portion 521 in the direction away from the accommodation space, the third portion 523 being located partially outside the accommodation space, the third portion 523 is connected to the feed point part 24 correspondingly.

Specifically, the surface of the protruding platform 153 on the side close to the speaker unit 30 is an inclined surface 1531, and the second portion 522 is formed by extending along the inclined surface 1531 in the direction close to the lower cover 20.

Compared with the related art, in the speaker box provided by the present application, the elastic piece is connected with the speaker unit, the elastic piece extends to the extension part in a bent manner and the flexible circuit board is connected with the elastic piece on the extension part, so that the flexible circuit board can be smoothly guided to a feed point position, and the communication of the flexible circuit board and an external circuit is effectively guaranteed.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A speaker box, comprising:
    an upper cover having a top wall, a side wall formed by bending and extending from the periphery of the top wall to the lower cover, an extension part formed by extending from the side wall;
    a lower cover assembled with the upper cover for forming an accommodation space;
    a speaker unit accommodated in the accommodation space;
    a flexible circuit board connecting the speaker unit to an external circuit;
    an elastic piece electrically connecting the flexible circuit board to the speaker unit; wherein
    the elastic piece comprises a welding part connected to the speaker unit, a connection part fixed to the extension part and a bending part connecting the welding part and the connection part; a projection of the welding part in the side wall thickness direction and a projection of the connection part in the side wall thickness direction are spaced apart from each other; the flexible circuit board is connected with the connection part and extends out of the accommodation space to be connected with an external circuit.

2. The speaker box as described in claim 1, wherein the bending part is formed by bending and extending from the welding part in the direction close to the lower cover, the connection part is formed by bending and extending from one end of the bending part away from the welding part in the direction away from the speaker unit, and the connection part is located on the extension part.

3. The speaker box as described in claim 2, wherein the speaker unit is provided with a welding plate for electrical connection, and the welding part is welded and fixed with the welding plate.

4. The speaker box as described in claim 3, wherein the extension part comprises a main body formed by extending from the side wall and positioning columns formed by protruding and extending from the main body in the direction close to the lower cover; the connection part comprises positioning areas and a welding area connected with the positioning areas; the positioning areas are provided with positioning holes mated with the positioning columns, the positioning columns are correspondingly inserted into the positioning hole, and the flexible circuit board is welded and fixed with the welding area.

5. The speaker box as described in claim 4, wherein the positioning areas are spaced from each other, and the welding areas are located between the two positioning areas; both the positioning areas are provided with the positioning holes, the positioning columns are provided with two, and the two positioning columns are respectively arranged corresponding to the two positioning holes.

6. The speaker box as described in claim 4, wherein the flexible circuit board comprises a welding plate part which is welded with the welding area and a conductive part which is connected with the welding plate part at one end and extends out of the accommodation space at the other end.

7. The speaker box as described in claim 6, wherein the extension part further comprises a protruding platform formed by extending from an edge of the main body in the direction close to the lower cover; the conductive portion comprises a first portion bending and extending from the welding plate part in the direction away from the lower cover and located on the main body, a second portion extending from an end of the first portion near the protruding platform along the protruding platform in the direction close to the lower cover, and a third portion formed by bending and extending from an end of the second portion away from the first portion in the direction away from the accommodation space, the third portion being located partially outside the accommodation space.

8. The speaker box as described in claim 7, wherein the lower cover comprises a bottom wall, a side surface formed by bending and extending from a periphery of the bottom wall in the direction close to the upper cover, an avoidance groove formed by being depressed from a side of the side surface near the upper cover in the direction away from the upper cover, and a feed point part extending from the side surface in the direction away from the accommodation space; the avoidance groove is arranged corresponding to the protruding platform, the feed point part is located on a side of the avoidance groove away from the protruding platform, the third portion is connected to the feed point part.

9. The speaker box as described in claim 1 including two elastic pieces, wherein the two elastic pieces are arranged opposite to each other with a distance and are respectively connected with the speaker unit.

10. The speaker box as described in claim 1, wherein the elastic piece further comprises a mounting hole extending through the welding part.

\* \* \* \* \*